US007768342B1

(12) United States Patent
McMahill (10) Patent No.: US 7,768,342 B1
(45) Date of Patent: Aug. 3, 2010

(54) BIAS CIRCUIT WITH NON-LINEAR TEMPERATURE CHARACTERISTICS

(75) Inventor: Daniel R. McMahill, Woodstock, GA (US)

(73) Assignee: Maxim Integrated Products, Sunnyvale, CA (US)

( * ) Notice: Subject to any disclaimer, the term of this patent is extended or adjusted under 35 U.S.C. 154(b) by 9 days.

(21) Appl. No.: 12/126,846

(22) Filed: May 23, 2008

(51) Int. Cl.
*G05F 3/02* (2006.01)
(52) U.S. Cl. .................. 327/538; 327/512; 323/315
(58) Field of Classification Search .......... 327/512, 327/513, 543, 538, 539, 540, 54; 323/315, 323/316
See application file for complete search history.

(56) References Cited

U.S. PATENT DOCUMENTS

| 6,094,093 | A  | * | 7/2000 | Karanicolas | ............ | 327/560 |
| 6,600,303 | B2 | * | 7/2003 | Ikehashi | ............ | 323/315 |
| 6,922,045 | B2 |   | 7/2005 | Self et al. | | |
| 7,233,214 | B2 |   | 6/2007 | Kim et al. | | |
| 2004/0061550 | A1 | * | 4/2004 | Idei et al. | ............ | 327/543 |
| 2005/0174099 | A1 | * | 8/2005 | Ohkubo et al. | ............ | 323/315 |
| 2006/0091940 | A1 | * | 5/2006 | Kimura | ............ | 327/543 |
| 2007/0046364 | A1 | * | 3/2007 | Yokoo | ............ | 327/539 |

* cited by examiner

*Primary Examiner*—Lincoln Donovan
*Assistant Examiner*—Shikha Goyal
(74) *Attorney, Agent, or Firm*—TIPS Group (57) ABSTRACT

In an embodiment, a current source having a piece-wise linear relationship between current and temperature is provided. The current source includes a first current source to provide current based on a first current-temperature relationship. The current source further includes a second current source coupled in parallel to the first current source. The second current source is to provide current based on a second current-temperature relationship. The current source further includes first mirroring circuitry to mirror a sum of the first current source and the second current source to an output current source. The current source also includes second mirroring circuitry to mirror the sum of the first current source and the second current source for comparison with a third current source. The third current source provides a minimum current magnitude and the third current source is coupled to the second current source to control output of the second current source.

25 Claims, 5 Drawing Sheets

BIAS CIRCUIT WITH NON-LINEAR TEMPERATURE CHARACTERISTICS

BACKGROUND

In a typical operational transconductance amplifier, the bias current must increase with increasing temperature to maintain a constant small signal bandwidth. Because of this, it is typical to employ a bias circuit that provides a larger bias current at higher temperatures. This allows a lower bias current at room temperature while maintaining performance at high temperatures.

This positive slope of the bias current versus temperature may be as much as 85% of a true proportional to absolute temperature current. The slope is typically controlled by adding a PTAT current to a current that is constant over temperature. An issue typically associated with this type of biasing is that the large signal behavior of the amplifier under slew rate limited conditions degrades at low temperatures. This is because the available charging current is lower. With an 85% PTAT slope, the current at −40° C. can be 22% lower than at +40° C.

In view of the foregoing, it may be useful to provide methods and systems that facilitate non-linear temperature dependence for CMOS operational transconductance amplifiers. Similar provision of methods and systems for other technologies, such as bipolar or other MOSFET (e.g. NMOS or PMOS) circuits may also be useful.

The foregoing examples of the related art and limitations related therewith are intended to be illustrative and not exclusive. Other limitations of the related art will become apparent to those of skill in the art upon a reading of the specification and a study of the drawings. Additionally, limitations and disadvantages of the related art may become apparent from review of other related art itself.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In an embodiment, a current source having a piece-wise linear relationship between current and temperature is provided. The current source includes a first current source to provide current based on a first current-temperature relationship. The current source further includes a second current source coupled in parallel to the first current source. The second current source is to provide current based on a second current-temperature relationship. The current source further includes first mirroring circuitry to mirror a sum of the first current source and the second current source to an output current source. The current source also includes second mirroring circuitry to mirror the sum of the first current source and the second current source for comparison with a third current source. The third current source provides a minimum current magnitude and the third current source is coupled to the second current source to control output of the second current source.

In addition to the example aspects and embodiments described above, further aspects and embodiments will become apparent by reference to the drawings and by study of the following descriptions.

BRIEF DESCRIPTION OF THE DRAWINGS

Example embodiments are illustrated in referenced figures of the drawings. It is intended that the embodiments and figures disclosed herein are to be considered illustrative rather than limiting—they provide examples of embodiments.

DETAILED DESCRIPTION

An apparatus, system and method is provided for a non-linear current source. The specific embodiments described in this document represent exemplary instances of the present invention, and are illustrative in nature rather than restrictive.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

An embodiment contemplates a current source for an operational transconductance amplifier for which input current and output current have a linear relationship above a certain temperature and a different linear relationship below that certain temperature. Another embodiment provides for a current source for an operational transconductance amplifier which has a linear input/output current relationship above room temperature and a different linear relationship below that temperature. These embodiments may be used in conjunction with other circuits for which similar current requirements exist. Moreover, the current source may be devised with different components to allow for different behavior—such as different relationships between current and temperature. For example, piecewise linear relationships are described herein, but non-linear relationships may be used for all or part of a relationship in some embodiments.

Figure 1:
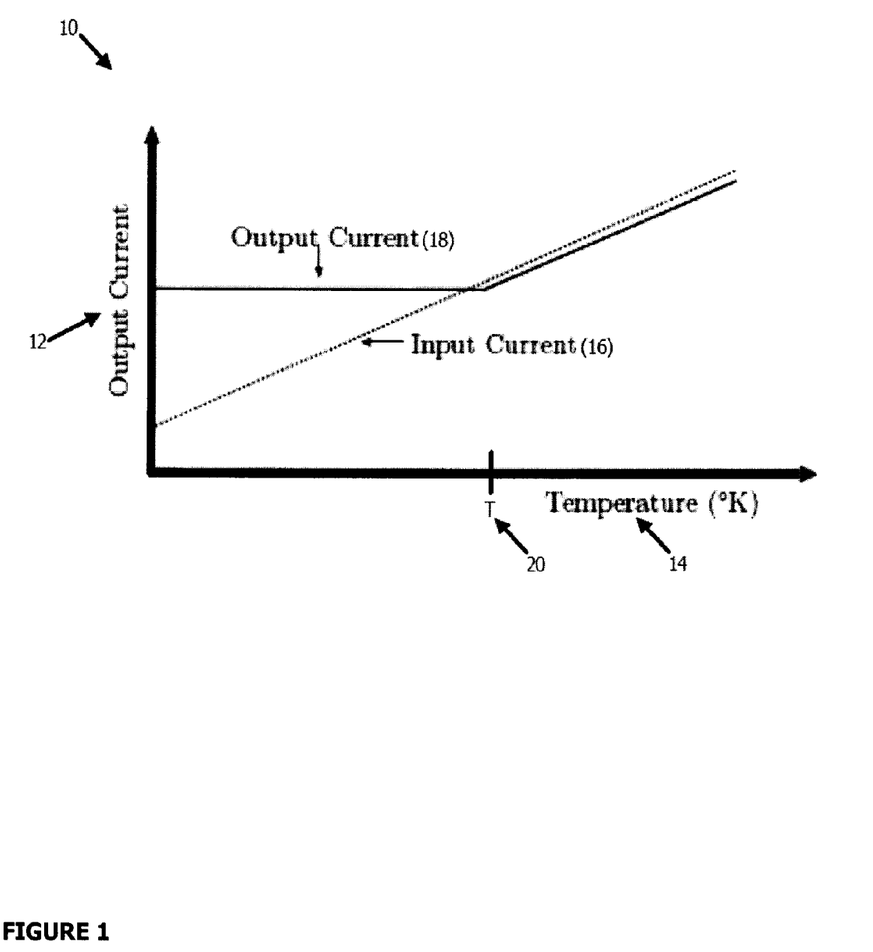
FIG. 1 is a graph illustrating a temperature and output current relationship, in accordance with an embodiment.

One relationship (for one embodiment) is illustrated via FIG. 1 which is a graph 10 of output current 12 versus temperature 14. As temperature 14 increases, input current 16 will also typically increase. Likewise, output current 18 will also typically increase with increasing temperature 14 above a temperature T 20. Below temperature T 20, the output current 18 will typically essentially remain constant. Typically, a temperature below T 20 encompasses a room temperature range. It should be noted that the output current 18 curve and the input current 16 curve are slightly offset from each other so that each may be easily visualized, and that each represents a relatively idealized curve which may vary slightly with varying manufacturing conditions, for example.

Figure 2:
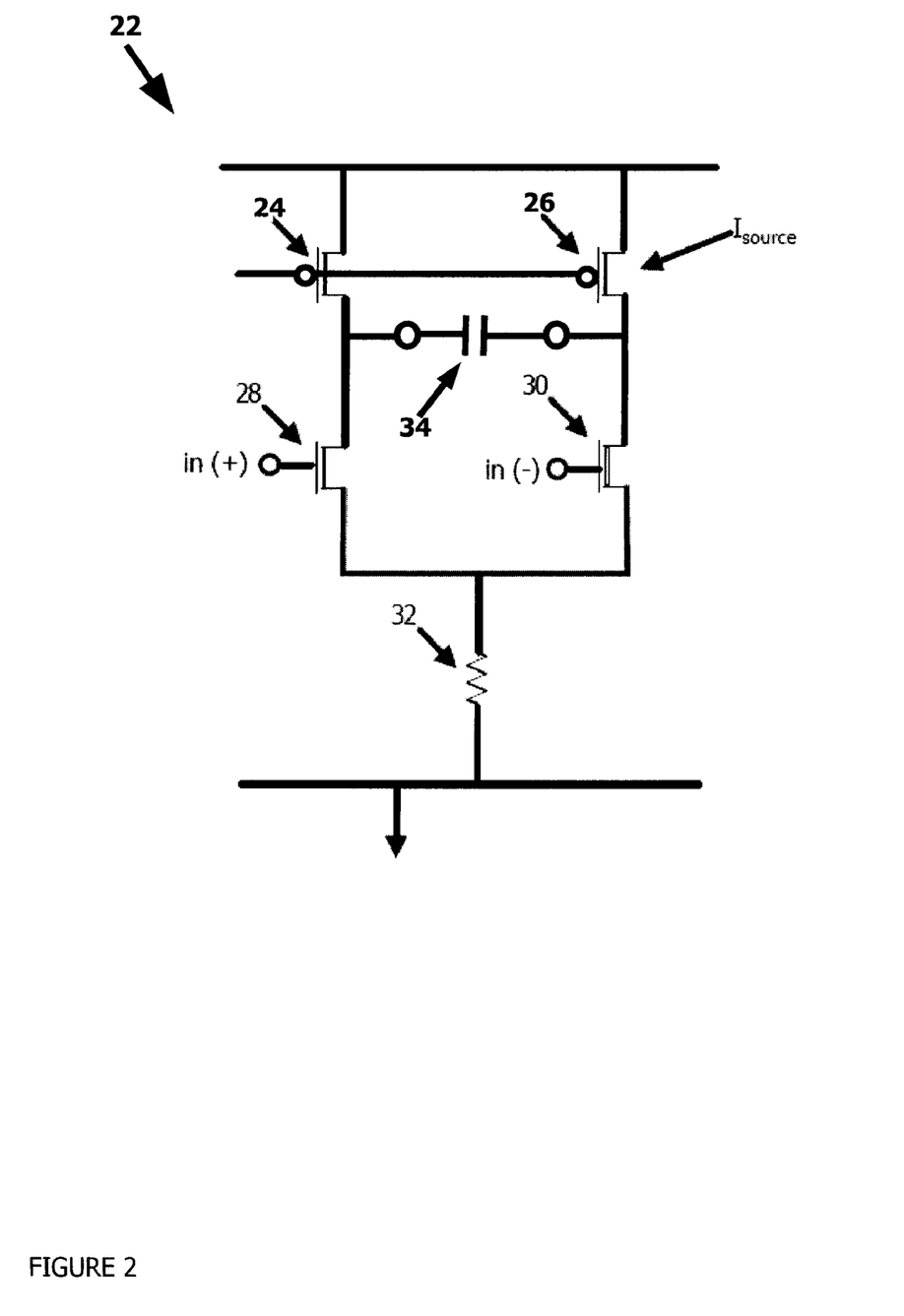
FIG. 2 is a circuit diagram illustrating an embodiment of a transconductance amplifier.

For informational purposes, a typical operational amplifier circuit 22 is depicted in FIG. 2. An operational amplifier circuit 22 is typically a DC-coupled high-gain amplifier with differential inputs and either a differential or a single output. Typically the output of the operational amplifier circuit 22 is controlled either by negative feedback, which largely determines the magnitude of its output voltage gain, or by positive feedback, which facilitates regenerative gain and oscillation. One type of amplifier which may be used is an operational transconductance amplifier. One may design operational amplifiers in a myriad number of ways, for many varied applications. Similarly, other circuits may also be used with current sources. However, the illustrated operational amplifier provides one example of a circuit which may use a current source.

Circuit 22 typically includes a pair of P-MOSFETS (24, 26) whose gates are coupled to each other. A drain of P-MOSFET 24 is coupled to a drain of N-MOSFET 28 and a drain of P-MOSFET 26 is coupled to a drain of N-MOSFET 30. The sources of N-MOSFETs 28 and 30 are coupled to each other. Additional components include a resistor 32 (which may represent more active circuitry) coupled to the sources of N-MOSFETs 28 and 30 as well as a load (represented as a capacitor) 34. This type of operational amplifier steers current between the two branches (transistors 24 and 28 in one branch, transistors 26 and 30 in the other branch), and produces an amplified signal at load 34 based on a differential of the signals at the gates of transistors 28 and 30.

Figure 3:
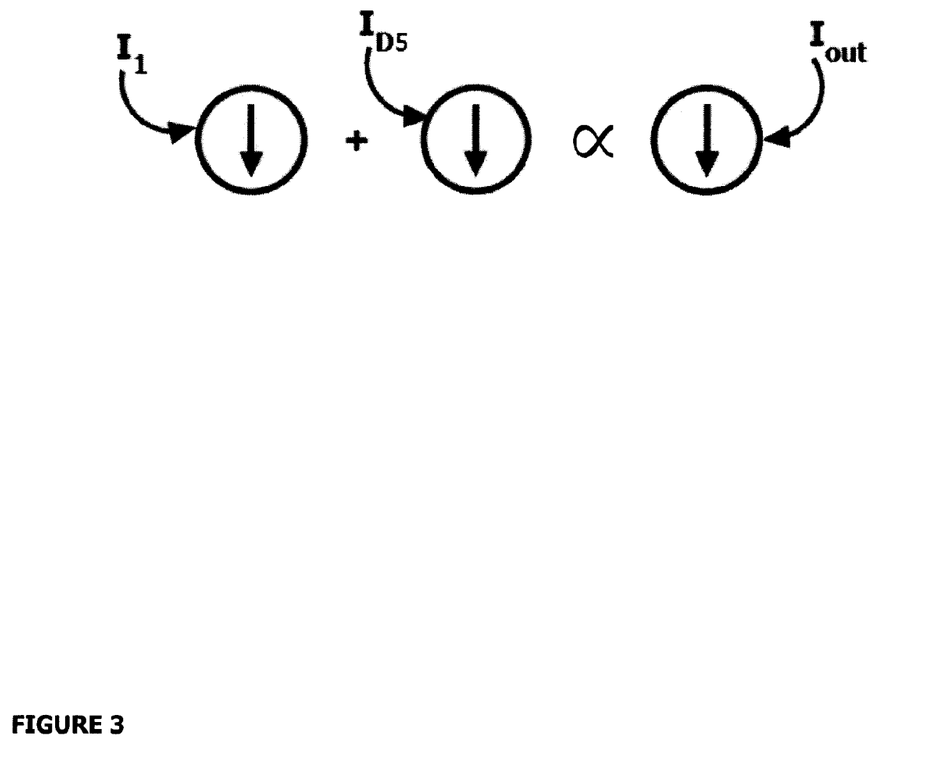
FIG. 3 is a diagram illustrating current relationships of an embodiment of a current source for an embodiment of an operational transconductance amplifier.
Figure 4:
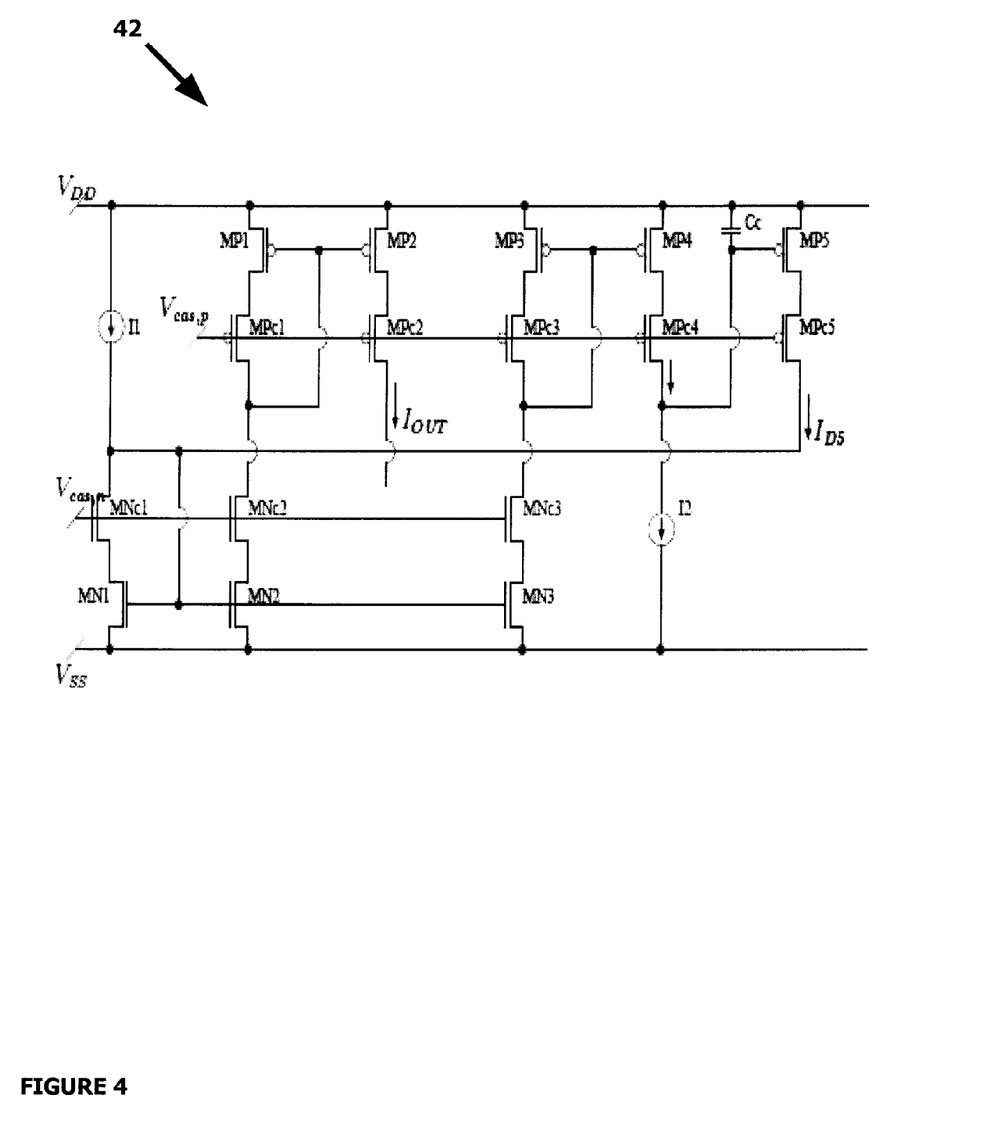
FIG. 4 is a circuit diagram illustrating an embodiment of a current source.

Now referring to FIGS. 3 and 4, FIG. 3 is a diagram illustrating current relationships of a current source, in some embodiments, and FIG. 4 is a circuit diagram illustrating an implementation of an embodiment of a current source. Currents $I_1$ and $I_{D5}$ combine to form a current that is proportional to output current $I_{OUT}$, as indicated in FIG. 3. FIG. 4 shows a schematic for a circuit 42 which produces nonlinear current versus temperature. A feedback loop adjusts $I_{D5}$ such that $I_1+I_{D5}=I_2$ with the constraint that $I_{D5}$ is a positive current. $I_1$ is a temperature dependent current and $I_2$ is essentially a constant current. Below room temperature, a current regulator loop is operational and the output current ($I_{OUT}$) will typically be fixed. Above room temperature, $I_{D5}$ will typically drop to zero and the regulator loop will typically no longer contribute current (nor will it limit the current of $I_1$). MP2 will typically be a large PMOS transistor in a related amplifier (or other circuit). In such a circuit, there will typically be a large amount of capacitance at its gate 44. To avoid instability in the regulator loop, a second NMOS mirror (MN3) will typically drive a second PMOS diode connected device (MP3) in an effort to keep slow dynamics out of the loop. Due to this configuration, stability may be expected to be good over the entire temperature range, including near where the regulator drops out.

The specific schematic of circuit 42 may further illustrate operation of the circuit. Voltage rails VDD and VSS provide a power supply to the circuit. Coupled to VDD is current source I1, which is also coupled to MNc1, which in turn is couple to MN1. In general, elements named 'MN' are N-type MOSFETs and elements named 'MP' are P-type MOSFETs—any exceptions will be noted specifically. MNc1 is biased by a bias voltage signal denominated Vcas,n. MN1 has its gate coupled to the node at which current source I1 is coupled to MNc1. MN1 and MNc1 collectively provide a leg of the circuit, in this case between the node at one end of I1 and VSS.

A similar transistor leg is provided by MNc2 and MN2, with the gate of MN2 coupled to the gate of MN1, and the gate of MNc2 coupled to the gate of MNc1. Coupled to MNc2 is MPc1, which in turn is coupled to MP1, which is ultimately coupled to VDD. The gate of MP1 is coupled to the node at which MPc1 is coupled to MNc2, and the gate of MPc1 is coupled to a voltage bias signal denominated Vcas,p.

Also coupled to the node at which current source I1 is coupled to MNc1 is another leg. MPc5 is coupled to the node between I1 and MNc1, and MP5 is in turn coupled on one end to MPc5 and on the other end to VDD. Thus, a current from I1 and a current from MPc5 (ID5) both feed into MNc1. Additionally, the gate of MPc5 is coupled to the Vcas,p signal, and the gate of MP5 is coupled to one terminal of capacitor Cc. The other terminal of capacitor Cc is coupled to VDD.

An additional part of the circuit is provided by three legs of transistors and a current source. MP4 is coupled on one end to VDD and on the other end to MPc4 (forming one of the legs), which in turn is coupled to current source I2, which current source (I2) is coupled to VSS. The node at which MPc4 is coupled to I2 is also coupled to the gate of MP5 (and thus to the terminal of Cc). Another leg is formed by the transistor MP3, which is coupled on one end to VDD and on the other end to MPc3. Both MPc3 and MPc4 are coupled at their respective gates to Vcas,p. Another leg is formed from MN3, which is coupled to VSS on one end and to MNc3 on its (MN3's) other end, with MNc3 further coupled to MPc3. The gate of MNc3 is coupled to the gate of MNc1 (and thus to Vcas,n). The node at which MNc3 is coupled to MPc3 is also coupled to the gates of MP3 and MP4.

Additionally, the circuit provides one more leg of transistors, namely MP2 and MPc2. MP2 is coupled to VDD and to MPc2, and MPc2 is coupled to a load of the circuit, providing the current Iout. MPc2 is also coupled at its gate to MPc1 and thus to Vcas,p. The circuit in its entirety provides a current source with a current vs. temperature profile along the lines of that shown in FIG. 1.

Operation of the circuit may be understood based on this description: Current source I1 provides a current into MNc1 (and thus MN1), as does current ID5. The magnitude of current ID5 is controlled by the voltage across Cc—a higher voltage will result in a higher current. The current into MNc1 is mirrored to the leg made up of MNc3 and MN3 by the coupling of the gates of the associated transistors. This same current is then forced on the leg made up of MPc3 and MP3—the two legs are coupled together, requiring the same current in both. Moreover, this current is mirrored to the leg made up of MP4 and MPc4—where it (the current) is effectively compared to the current of I2. If the current of MNc1 is lower than the current of I2, the voltage across Cc will tend to rise, increasing ID5 and thereby bringing the current of MNc1 (I1+ID5) up to the current of I2. If the current of MNc1 is higher than the current of I2, the voltage across Cc will tend to fall, decreasing the value of ID5 and again forcing equality with I2. However, this feedback mechanism has no effect once ID5 hits zero. At that point, a further reduced voltage across Cc has no further effect—MP5 is shutoff and remains shutoff.

The current of MNc1 is mirrored through the leg of MNc2 and MN2, and likewise through the leg of MPc1 and MP1, such that the current passing through MP2 is proportional to the current of MNc1. One may expect that the geometries of MP1 and MP2 will result in a current in MP2 proportional to the current in MP1—with MP2 much larger than MP1. In particular, the gate length of MP1 and MP2 will be designed to be the same, but the width of MP2 will be proportionally larger than the width of MP1. One may use a ratio between width of the devices on the order if 100:1 or 150:1 in some embodiments. Depending on the proportionality desired, one may use ratios such as 10:1, 25:1, 50:1, 200:1, 300:1, 500:1, or any other ratio as desired. The coupling of the gates of MP1 and MP2 produces the same bias voltage on both devices, thereby controlling the current of MP2. As a result, MP2 may be used as the current supply for a circuit, such as a transconductance amplifier in one embodiment, for example. Note that the voltages Vcas,p and Vcas,n will generally be chosen for the circuit and supplied by a control circuit (not shown) which is well understood for current sources in general.

As mentioned previously, the input and output currents of FIG. 1 may be used in one embodiment. Namely, the input current of FIG. 1 may be the current vs. temperature curve for the current source of I1, whereas the output curve may represent the sum of I1 and ID5. Other current sources can be used to achieve other effects. For example, one may use a current source with a different temperature slope to achieve a slower dropoff in current over temperature. Likewise, one may use a current source with a different current-temperature relationship for comparison purposes. In the embodiment described, the current source I2 has a constant current magnitude over temperature, but one may use a current source with whatever relationship is desired for a given application.

It is possible to use the concept of current regulators which may only sink or may only source current to add additional breakpoints in the bias current versus temperature characteristics. This is illustrated via FIG. 5 which shows a bias circuit in which both the minimum and maximum output current are controlled. In addition, there is typically no requirement that the min/max current references be constant with temperature. They may have a non-zero temperature slope which may be either positive or negative. In addition, the main bias reference current that had a positive temperature slope in the preceding section, may also have a negative slope. In general, this circuit is capable of providing a piecewise linear bias current versus temperature characteristic with two break points. Supplementary breakpoints are possible through the inclusion of additional regulator loops. Moreover, as pointed out previously, the curve between breakpoints need not be linear—non-linear characteristics may be introduced if desired.

Figure 5:
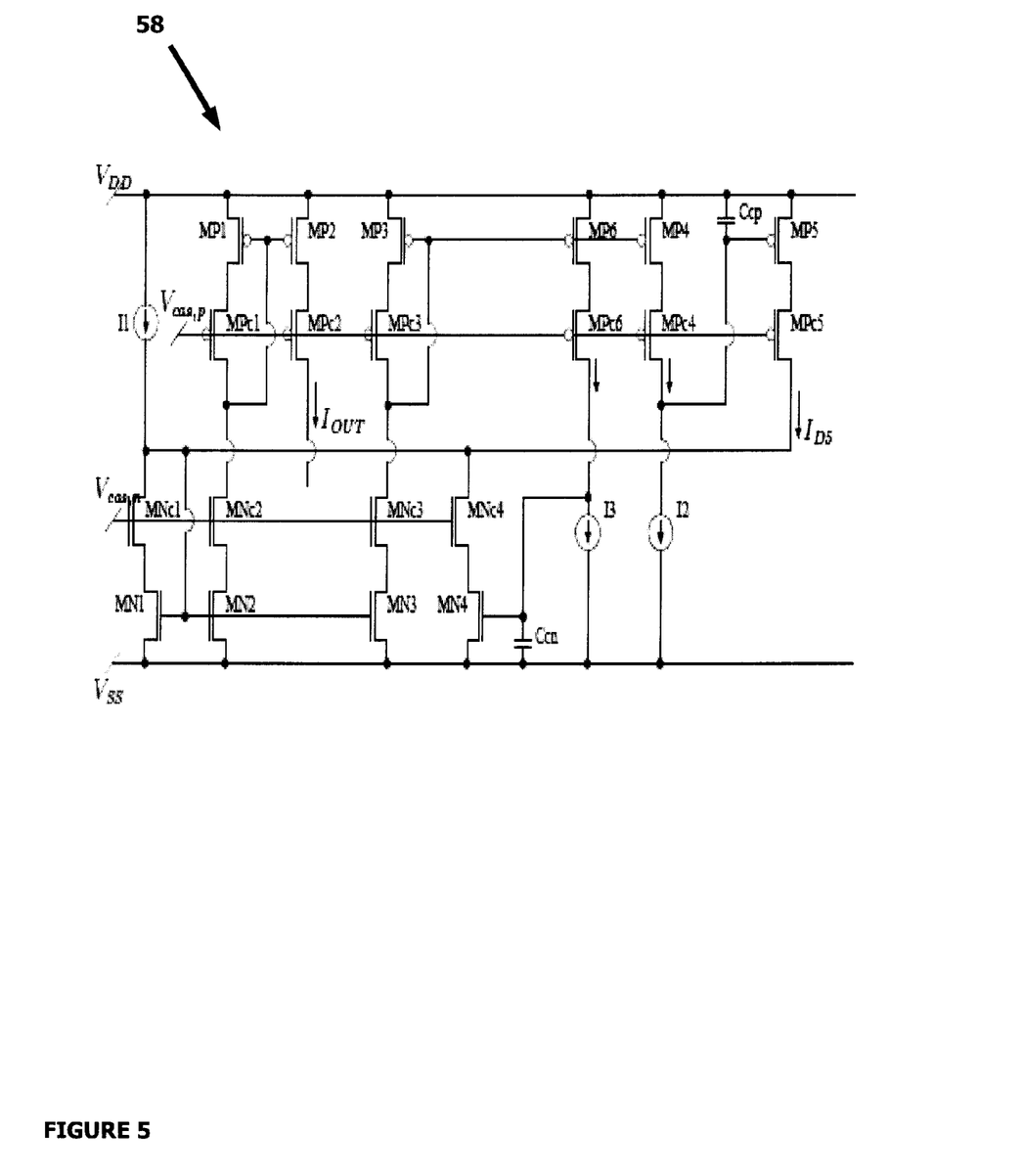
FIG. 5 is a circuit diagram illustrating another embodiment of a current source.

The circuitry of circuit 58 of FIG. 5 is similar to the circuitry of circuit 42 of FIG. 4. However, a capacitor Ccp is provided instead of capacitor Cc, and additional legs of circuitry are provided in conjunction with another current source. On one leg, the node coupled to I1 and MNc1 is also coupled to MNc4 which is in turn coupled to MN4, which is then coupled to VSS. The gate of MNc4 is coupled to Vcas,n. Another leg is provided which includes MP6 coupled on one end to VDD and on another end to MPc6, which is further coupled to current source I3, which in turn is coupled to VSS. A capacitor Ccn is provided, with one terminal coupled to VSS and the other terminal coupled to the gate of MN4. The gate of MN4 is further coupled to the node between MPc6 and 13. This circuit then provides a piece-wise linear relationship between current and temperature, with two breakpoints. The circuit, in addition to providing the constant output across temperature below a given temperature, may also be used to provide a constant output above a different temperature threshold, for example.

While a number of example aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A current source having a piece-wise linear relationship between current and temperature, the current source comprising:
    a first current source to provide current based on a first current-temperature relationship;
    a second current source coupled in parallel to the first current source, the second current source to provide current based on a second current-temperature relationship which is different from said first current-temperature relationship;
    first mirroring circuitry to mirror a sum of the first current source and the second current source to an output current source; and
    second mirroring circuitry to mirror the sum of the first current source and the second current source for comparison with a third current source, the third current source providing a minimum current magnitude, the third current source coupled to the second current source to control output of the second current source;
    wherein said output current source has a piece-wise linear relationship between current and temperature such that an output current of said output current source is variable within an operating temperature range.

2. The current source of claim 1, wherein:
    the first current source has a positively sloped current-temperature relationship; and
    the third current source has a constant output over temperature.

3. A current source having a piece-wise linear relationship between current and temperature, the current source comprising:
    a first current source to provide current based on a first current-temperature relationship;
    a second current source coupled in parallel to the first current source, the second current source to provide current based on a second current-temperature relationship;
    first mirroring circuitry to mirror a sum of the first current source and the second current source to an output current source;
    second mirroring circuitry to mirror the sum of the first current source and the second current source for comparison with a third current source, the third current source providing a minimum current magnitude, the third current source coupled to the second current source to control output of the second current source;
    a fourth current source; and
    third mirroring circuitry to mirror the sum of the first current source and the second current source for comparison with the fourth current source, the fourth current source providing a maximum current magnitude, the fourth current source coupled to the sum of the first current source and the second current source to control the sum of the first current source and the second current source.

4. The current source of claim 3, wherein the fourth current source has a constant output over temperature.

5. The current source of claim 4, wherein the third current source has a constant output over temperature, the output of the third current source is less than the output of the fourth current source.

6. The current source of claim 1, wherein the output current source is integrated into an external circuit.

7. The current source of claim 6, wherein the external circuit is an operational amplifier.

8. The current source of claim 6, wherein the external circuit is a transconductance amplifier.

9. The current source of claim 8, wherein the transconductance amplifier is included in an analog-to-digital converter.

10. The current source of claim 6, wherein the ratio of the magnitude of the output current source to the magnitude of the sum of the first and second current sources is designed to be about 100:1.

11. The current source of claim 6, wherein the ratio of the magnitude of the output current source to the magnitude of the sum of the first and second current sources is designed to be about 10:1.

12. The current source of claim 6, wherein the ratio of the magnitude of the output current source to the magnitude of the sum of the first and second current sources is designed to be about 50:1.

13. The current source of claim 6, wherein the ratio of the magnitude of the output current source to the magnitude of the sum of the first and second current sources is designed to be about 200:1.

14. The current source of claim 6, wherein the ratio of the magnitude of the output current source to the magnitude of the sum of the first and second current sources is designed to be about 300:1.

15. The current source of claim 3, wherein:
the fourth current source has a second relationship of current over temperature; and
the first current source has a first relationship of current over temperature.

16. The current source of claim 15, wherein the third current source has a constant output over temperature, the output of the third current source is less than the output of the fourth current source within an operating temperature range of the current source.

17. The current source of claim 1, wherein the third current source has a positively-sloped curve of current over temperature.

18. The current source of claim 1, wherein the third current source has a negatively sloped curve of current over temperature.

19. The current source of claim 1, wherein:
the third current source has a second relationship of current over temperature; and
the first current source has a first relationship of current over temperature.

20. An apparatus, comprising:
a first current source coupled to a first power supply source;
a first NMOS transistor coupled at a first terminal to the first current source, the first NMOS transistor coupled at a gate terminal to an NMOS bias signal;
a second NMOS transistor coupled at a first terminal to a second terminal of the first NMOS transistor, the second NMOS transistor coupled at a second terminal to a second power supply source, the second NMOS transistor coupled at a gate terminal to the first terminal of the first NMOS transistor;
a third NMOS transistor coupled at a second terminal to the second power supply source, the third NMOS transistor coupled at a gate terminal to the first terminal of the first NMOS transistor, the third NMOS transistor further having a first terminal;
a fourth NMOS transistor coupled at a second terminal to a first terminal of the third NMOS transistor, the fourth NMOS transistor coupled at a gate terminal to the NMOS bias signal, the fourth NMOS transistor further having a first terminal;
a first PMOS transistor coupled at a second terminal to a first terminal of the fourth NMOS transistor, the first PMOS transistor coupled at a gate terminal to a PMOS bias signal, the first PMOS transistor further having a first terminal;
a second PMOS transistor coupled at a second terminal to the first terminal of the fourth NMOS transistor, the second PMOS transistor coupled at a first terminal to the first power supply source, the second PMOS transistor coupled at a gate terminal to the first terminal of the fourth NMOS transistor;
a third PMOS transistor coupled at a first terminal to the first power supply source, the third PMOS transistor coupled at a gate terminal to the first terminal of the fourth NMOS transistor, the third PMOS transistor having a second terminal;
a fourth PMOS transistor coupled at a first terminal to the second terminal of the third PMOS transistor, the fourth PMOS transistor coupled at a gate terminal to the PMOS bias signal, the fourth PMOS transistor further having a second terminal;
a fifth PMOS transistor coupled at a gate terminal to the PMOS bias signal, the first PMOS transistor further having a first terminal and a second terminal;
a sixth PMOS transistor coupled at a first terminal to the first power supply source, the sixth PMOS transistor coupled at a gate terminal to the second terminal of the fifth PMOS transistor, the sixth PMOS transistor coupled at a second terminal to the first terminal of the fifth PMOS transistor;
a fifth NMOS transistor coupled at a first terminal to the second terminal of the fifth PMOS transistor, the fifth NMOS transistor coupled at a gate terminal to the NMOS bias signal, the fifth NMOS transistor further having a second terminal;
a sixth NMOS transistor coupled at a second terminal to the second power supply source, the sixth NMOS transistor coupled at a gate terminal to the first terminal of the first NMOS transistor, the sixth NMOS transistor coupled at a first terminal to the second terminal of the fifth NMOS transistor;
a seventh PMOS transistor coupled at a first terminal to the first power supply source, the seventh PMOS transistor coupled at a gate terminal to the second terminal of the fifth PMOS transistor, the seventh PMOS transistor further having a second terminal;
an eighth PMOS transistor coupled at a first terminal to the second terminal of the seventh PMOS transistor, the eighth PMOS transistor coupled at a gate terminal to the PMOS bias signal, the eighth PMOS transistor further having a second terminal;
a second current source coupled to the second terminal of the eighth PMOS transistor and coupled to the second power supply source;
a ninth PMOS transistor coupled at a gate terminal to the PMOS bias signal, the ninth PMOS transistor coupled at a second terminal to the first terminal of the first NMOS transistor, the ninth PMOS transistor further having a first terminal;

a tenth PMOS transistor coupled at a first terminal to the first power supply source, the tenth PMOS transistor coupled at a gate terminal to the second terminal of the eighth PMOS transistor, the tenth PMOS transistor coupled at a second terminal to the first terminal of the ninth PMOS transistor; and a first capacitor, the first capacitor coupled at a first terminal to the first power supply source and coupled at a second terminal to the gate terminal of the tenth PMOS transistor.

21. The apparatus of claim 20, wherein a ratio of the size of the third PMOS transistor to the second PMOS transistor is about 100:1.

22. The apparatus of claim 20, wherein a ratio of the size of the third PMOS transistor to the second PMOS transistor is about 200:1.

23. The apparatus of claim 20, wherein the first current source has a positively sloped current-temperature relationship and the second current source has a constant current output.

24. The apparatus of claim 20, wherein the apparatus is included in an operational amplifier.

25. An apparatus, comprising:

a first current source to provide current based on a first current-temperature relationship;

a second current source coupled in parallel to the first current source, the second current source to provide current based on a second current-temperature relationship;

first mirroring circuitry to mirror a sum of the first current source and the second current source to an output current source;

second mirroring circuitry to mirror the sum of the first current source and the second current source for comparison with a third current source, the third current source providing a minimum current magnitude, the third current source coupled to the second current source to control output of the second current source;

a fourth current source; and third mirroring circuitry to mirror the sum of the first current source and the second current source for comparison with the fourth current source, the fourth current source providing a maximum current magnitude, the fourth current source coupled to the sum of the first current source and the second current source to control the sum of the first current source and the second current source.

* * * * *